United States Patent [19]

Iacono

[11] Patent Number: 5,199,887
[45] Date of Patent: Apr. 6, 1993

[54] SURFACE MOUNTING CONNECTOR
[75] Inventor: Fred D. Iacono, Crestwood, N.Y.
[73] Assignee: Kings Electronics Co., Inc., Tuckahoe, N.Y.
[21] Appl. No.: 767,979
[22] Filed: Sep. 30, 1991
[51] Int. Cl.[5] .............................................. H01R 9/09
[52] U.S. Cl. ....................................... 439/83; 439/95; 439/581; 439/607
[58] Field of Search .................... 439/63, 78, 81, 83, 439/95, 581, 607, 883

[56] References Cited

U.S. PATENT DOCUMENTS

| 3,564,478 | 2/1971 | Hampton | 439/581 |
| 3,910,665 | 10/1975 | Stull | 439/581 |
| 4,684,200 | 8/1987 | Capp | 439/63 |
| 5,030,140 | 7/1991 | Sugiyama | 439/607 |
| 5,062,809 | 11/1991 | Sakamoto et al. | 439/581 |

FOREIGN PATENT DOCUMENTS 2917111  11/1980  Fed. Rep. of Germany ...... 439/581

Primary Examiner—Paula A. Bradley
Attorney, Agent, or Firm—Jordan B. Bierman

[57] ABSTRACT

A surface mounted connector adapted to attach a cable to a printed circuit board wherein all contacts necessary to establish electrical continuity between the circuit board and connector are made on a single surface of the circuit board.

9 Claims, 1 Drawing Sheet

SURFACE MOUNTING CONNECTOR

The present invention is directed to a connector and, more specifically, to a connector adapted to be attached to a printed circuit board.

BACKGROUND OF THE INVENTION

It is often necessary to provide means to attach coaxial cables to printed circuit boards in electronic equipment. The standard method for doing so is to provide a connector body, adapted to receive the coaxial cable, the connector body making electrical contact with the printed circuit board by soldered pins or collapsible needles, which pass through corresponding holes in the printed circuit board. Electrical continuity is provided through these pins or needles.

The recent trend has been to miniaturize electronic equipment as much as possible, and one manner in which this is accomplished is to use printed circuit boards wherein there is a printed circuit on each side thereof. Using connectors in which electrical contacts are made through soldered pins or collapsible needles, however, is difficult with these double-sided printed circuit boards as the means by which the electric circuit is made with the circuit printed on the first side of the printed circuit board, passes through to the second side of the printed circuit board. It would therefore be advantageous to provide a means for surface mounting a connector to a printed circuit board, whereby all electrical connections are made on a single surface of the board.

BRIEF DESCRIPTION OF THE INVENTION

In view of the foregoing, it is an object of the present invention to provide a means for surface mounting connectors to a printed circuit board using a connector body, in which all electrical connections between the connector body and the printed circuit board can be made on a single surface thereof. Although usable with standard circuit boards, this configuration is especially well suited for connecting coaxial cable to double-sided printed circuit boards, as it can be used without requiring that the printed circuit on the second side of the circuit board be formed to avoid the electrical contacts of the circuit on the first side. Other objects and features of the present invention will become apparent from the following detailed description considered in conjunction with the accompanying drawings.

DETAILED DESCRIPTION OF THE INVENTION

Figure 1:
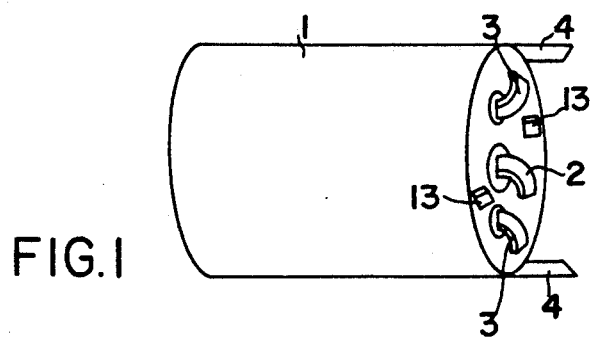
FIG. 1 is a side/bottom view of the inventive connector.
Figure 2:
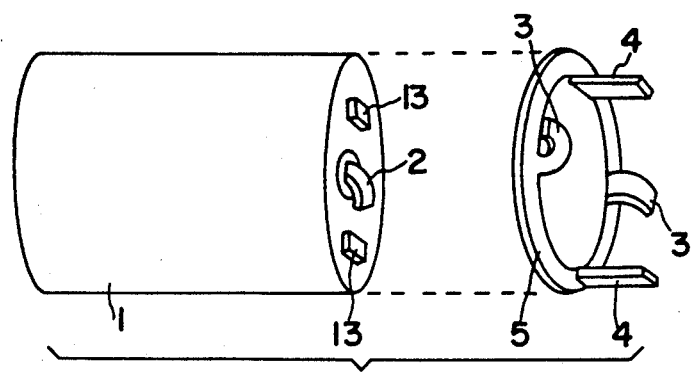
FIG. 2 illustrates a preferred embodiment of the invention wherein the inventive connector is formed as two pieces, to be attached to each other before connection to the printed circuit board.

Referring to FIG. 1, there is shown an inventive connector adapted to be surface mounted on a printed circuit board. The connector comprises connector body 1 having provided thereon center contact 2. Center contact 2 is advantageously a spring finger, wire-form spring, or some other compressible contact means. Also provided are a plurality of grounding contacts 3, also advantageously formed as spring fingers, as well as hold down tabs 4. To ease manufacture of the inventive connector, it is possible to form ground contacts 3 and hold down tabs 4 on a spring contact grounding ring 5 which can be attached to connector body 1 prior to the connection thereof with the printed circuit board as shown in FIG. 2. Ring 5 can be produced by stamping and forming with a die. The ring can be secured to the connector body by soldering or other mechanical means. The end of the inventive connector, opposite to that on which the center contact and hold down tabs 4 are provided, is open to receive a cable.

Figure 3:
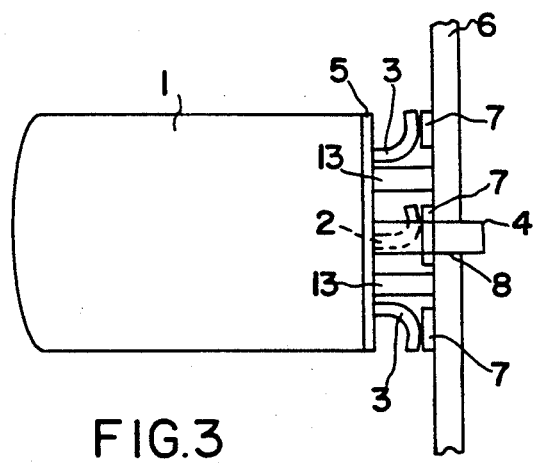
FIG. 3 is a sectional side view of the inventive connector as attached to a printed circuit board.

FIG. 3 illustrates the inventive connector, secured to a printed circuit board. The connector is attached by pressing connector body 1 against printed circuit board 6 so that hold down tabs 4 pass through holes 8 in printed circuit board 6. Center contacts 2 and grounding contacts 3 are brought into contact with printed circuit board contacts 7. To secure connector body 1 to printed circuit board 6, hold down tabs 4 are staked or formed over the opposite side of the printed circuit board. Hold down tabs 4 are provided only to hold connector body 1 in place, and are not required to provide an electrical contact. Spacer tabs 13 can be provided to insure proper spacing between center contacts 2, grounding contacts 3, and printed circuit board 6. As no part of the inventive connector passing through printed circuit board 6 establishes an electric circuit, printed circuit board 6 can easily be provided with circuits on both sides thereof.

Figure 4:
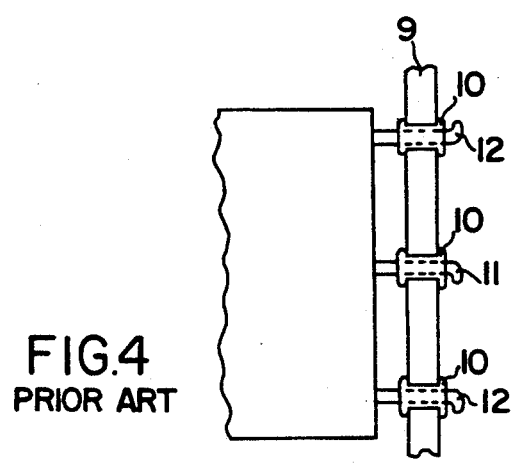
FIG. 4 is an illustration of the connecting means necessary with prior art connectors.

In contrast to the above, FIG. 4 illustrates the connections necessary with a prior art connector. In the prior art, printed circuit board 9 is provided with plated through holes 10, which are attached directly to a printed circuit. The connector is brought into contact with printed circuit board 9 so that center connector 11 and grounding connectors 12 pass through corresponding through-holes 10. These contacts are then either staked in place or soldered. Since electrical components of the coaxial cable connector pass through the printed circuit board 9, a circuit cannot be printed on the opposite side thereof.

Although described as being especially useful with double-sided printed circuit boards, it is stressed that the inventive surface mounted connector can be used with standard, single-sided circuit boards as well. While only the fundamental novel features of the invention as applied to a preferred embodiment thereof have been shown and described, it is understood that various omissions, substitutions, and changes in the form and details of the device illustrated and in its operation, may be made by those skilled in the art without departing from the spirit of the invention. It is therefore the intention of Applicant that the invention be limited only by the scope of the claims appended hereto.

I claim:

1. A connector for surface mounting a cable to a single surface of a printed circuit board, said connector comprising;
    a connector body comprising a first end adapted to receive a cable and a second end, opposite said first end, having a center contact for establishing an electrical connection with said printed circuit board, at least one grounding contact adapted to contact corresponding printed circuit board grounding pads, and hold down tabs for attaching said connector to said printed circuit board, said grounding contacts and hold down tabs being formed on a separate support ring, attached to said second end of said connector body.

2. The connector of claim 1 wherein said center contact comprises a spring finger.

3. The connector of claim 1 wherein said center contact comprises a wire-form spring.

4. The connector of claim 1 wherein said grounding contacts comprise spring fingers.

5. The connector of claim 1 wherein said support ring is soldered onto said connector body.

6. A connector for surface mounting a cable to a single surface of a printed circuit board, said connector comprising;
 a connector body comprising a first end adapted to receive a cable and a second end, opposite said first end, having a center contact for establishing an electrical connection with said printed circuit board, and at least one grounding contact adapted to contact corresponding printed circuit board grounding pads, said connector body further comprising mounting apparatus for mechanically mounting said connector body to said printed circuit board, wherein said mounting apparatus comprises hold down tabs adapted to pass through corresponding holes in said printed circuit board and be formed over to mechanically hold said connector body in place on said printed circuit board.

7. The connector of claim 6 wherein said center contact comprises a spring finger.

8. The connector of claim 6 wherein said center contact comprises a wire-form spring.

9. The connector of claim 6 wherein said grounding contacts comprise spring fingers.

* * * * *